United States Patent [19]

Wang et al.

[11] 4,186,391
[45] Jan. 29, 1980

[54] APPARATUS FOR DETECTING DIODE FAILURES IN MULTIPLE DIODE RECTIFIER BRIDGES

[75] Inventors: Shou-I Wang, Old Bridge; Charles M. Hansen, Jr., Ocean City, both of N.J.

[73] Assignee: The Bendix Corporation, Teterboro, N.J.

[21] Appl. No.: 936,266

[22] Filed: Aug. 22, 1978

[51] Int. Cl.² ............................................. G08B 21/00
[52] U.S. Cl. .................................. 340/645; 340/650; 363/53
[58] Field of Search ............... 340/510, 513, 645, 650, 340/651, 653; 324/51, 158 D; 307/321; 363/46, 52, 53, 67, 68, 132

[56] References Cited

U.S. PATENT DOCUMENTS

| | | | |
|---|---|---|---|
| 3,069,614 | 12/1962 | Steinert et al. | 363/53 |
| 3,243,796 | 3/1966 | Harmon et al. | 340/645 |
| 3,474,436 | 10/1969 | Burton | 340/645 |
| 3,496,414 | 2/1970 | Logston, Jr. | 340/650 |
| 3,745,548 | 7/1973 | Skelton et al. | 340/645 |
| 3,806,906 | 4/1974 | Young | 340/645 |
| 3,818,330 | 6/1974 | Hiroshima et al. | 340/653 |
| 4,133,017 | 1/1979 | Johnson et al. | 340/645 |

Primary Examiner—Gerald Brigance
Attorney, Agent, or Firm—Anthony F. Cuoco; William F. Thornton

[57] ABSTRACT

A circuit for detecting a failed diode in a multiple diode rectifier bridge detects open or shorted diodes in both multi-phase, half-wave rectification and single or multi-phase full wave rectification arrangements and provides a failure signal for sounding an alarm or tripping the circuit to protect the load or power source as the case may be.

9 Claims, 1 Drawing Figure

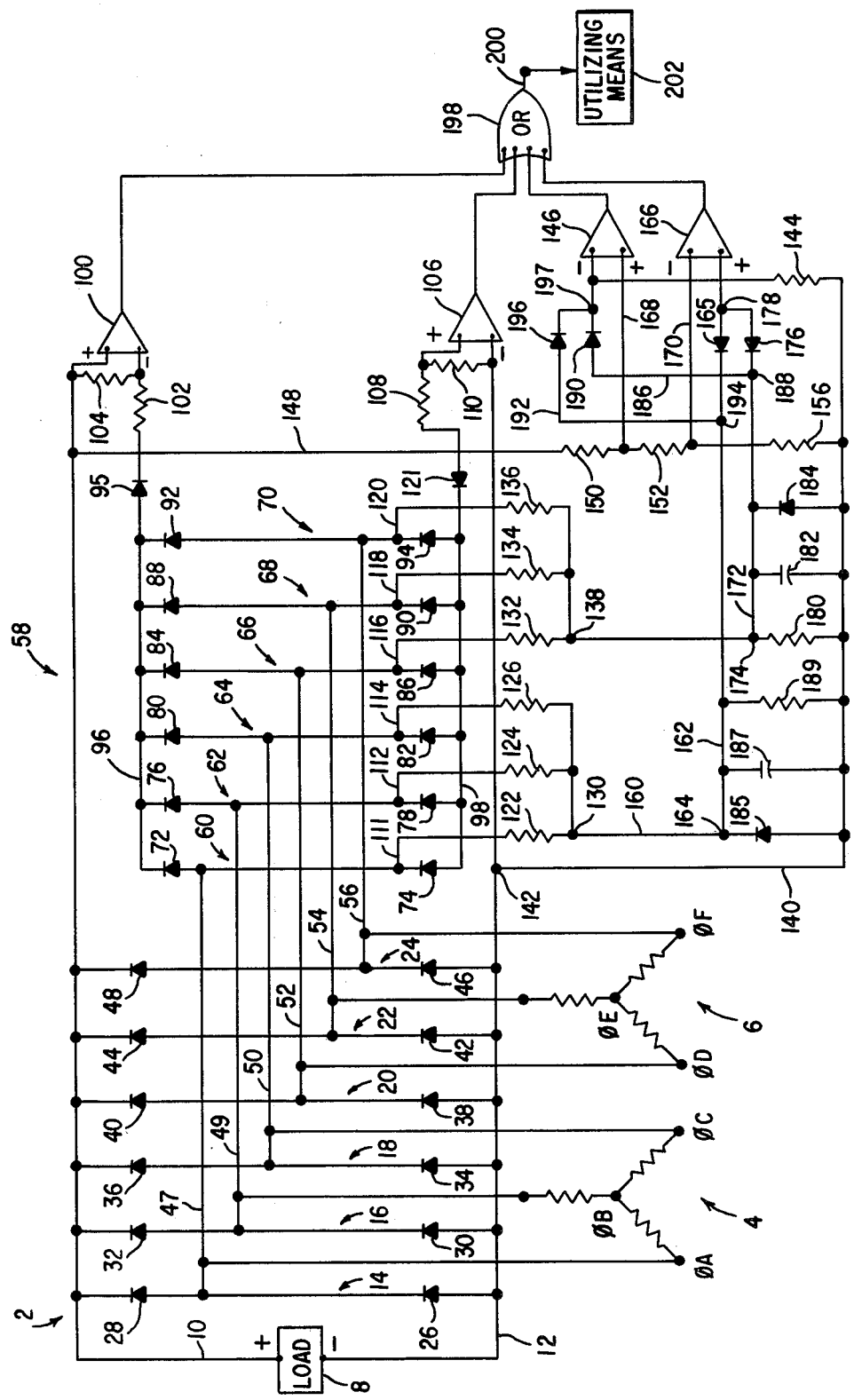

APPARATUS FOR DETECTING DIODE FAILURES IN MULTIPLE DIODE RECTIFIER BRIDGES

FIELD OF THE INVENTION

This invention relates generally to electrical systems for rectifying an AC voltage to provide a DC voltage and, particularly, to diode rectifiers for the purposes described. More particularly, this invention relates to means for detecting diode failures, i.e., shorts or opens.

PRIOR ART

Detecting an open diode in a simple rectifier circuit is a fairly easy task since the effective voltage decreases and a missing AC peak is evident when the voltage waveform is viewed on an oscilloscope. In a six-phase alternator arrangement with a closed-loop voltage regulator, for purposes of illustration, the voltage does not decrease and the short conduction cycle of each diode does not make the missing peak from one open diode visually evident. This is especially true if the frequency of the rectified AC is fairly high, and the AC waveform is purposely shaped with a flat top to decrease DC ripple.

A shorted diode produces severe winding overload currents, and can introduce AC into the load which is usually an undesirable condition if solid state loads are involved. Since significant damage can occur, it is necessary to detect and de-energize a rectifier bridge with a shorted diode in as short a time as possible. The observable results of a shorted diode in a closed loop alternator are high phase currents, low line-to-line AC voltage, high DC ripple voltage, and high negative and zero-sequence components in the AC waveforms. If the output is not regulated, a decrease in DC output voltage may also be evident.

Prior to the present invention, rectifier monitoring circuits have included a plurality of parallel power supplies connected to a common load via a coupling diode. A comparator monitors the voltage across the coupling diode and the peak conducting voltage across the supply rectifier devices, and when the voltage across the coupling diode exceeds the voltage from the rectifying devices an alarm signal is generated. A device of this type is described in U.S. Pat. No. 3,916,399, issued to Bishop, et al, on Oct. 28, 1975.

Another device for the purpose described involves a cell surveillance monitor for a power converter wherein each diode is monitored by its own inductive current detector. A logic circuit monitoring all the individual inductive current detectors provides an alarm signal when a failed diode is detected. A device of this type is described in U.S. Pat. No. 3,806,906, issued to Young on Apr. 23, 1974.

Neither of these prior art devices are comparable to the present device which is applicable to both multi-phase half-wave rectification and single or multi-phase full-wave rectification when more than one rectifier is involved.

SUMMARY OF THE INVENTION

This invention contemplates circuitry of the type described wherein a detector bridge having the same diode arrangement as a rectifier bridge being monitored is provided. AC phase voltages and positive and negative DC voltages are applied to the detector bridge and an arrangement of resistors is used to create a "phantom neutral" voltage at their common connection. As long as all rectifier diodes are in an operative state (no shorts or opens) the phantom averaged neutral voltage will be exactly half the DC output voltage of the rectifier bridge and the detector bridge DC voltage will equal the rectifier bridge output voltage. A shorted diode results in a shift in the phantom neutral voltage and an open diode is detected by comparing the ripple voltage of the rectifier bridge with that of the detector bridge. While particularly adaptable to generating systems, the invention to be herein described can be used in any arrangement wherein the rectification of AC voltage to provide DC voltage is involved.

BRIEF DESCRIPTION OF THE DRAWINGS

The single FIGURE of the drawing is an electrical schematic diagram showing a multiple diode rectifier bridge in association with the windings of a brushless type alternator, and a detecting bridge for detecting failures in the rectifier bridge diodes.

DESCRIPTION OF THE INVENTION

For purposes of illustration, the invention will be described with reference to a rectifier bridge 2 associated with a fixed phase brushless alternator having two three-phase windings 4 and 6 displaced by 60°. The phases of winding 4 are designated as $\phi A$, $\phi B$ and $\phi C$ while the phases of winding 6 are designated as $\phi D$, $\phi E$ and $\phi F$.

A load 8 has a conductor 10 leading to the positive terminal and a conductor 12 leading to the negative terminal thereof. Rectifier bridge 2 includes diode pairs 14, 16, 18, 20, 22 and 24 connected across conductors 10 and 12. Diode pair 14 includes diodes 26 and 28; diode pair 16 includes diodes 30 and 32; diode pair 18 includes diodes 34 and 36; diode pair 20 includes diodes 38 and 40; diode pair 22 includes diodes 42 and 44; and diode pair 24 includes diodes 46 and 48. The cathodes of diodes 28, 32, 36, 40, 44 and 48 are connected to conductor 10, while the anodes of diodes 26, 30, 34, 38, 42 and 46 are connected to conductor 12.

A conductor 47 is connected intermediate diodes 26 and 28; a conductor 49 is connected intermediate diodes 30 and 32; a conductor 50 is connected intermediate diodes 34 and 36; a conductor 52 is connected intermediate diodes 38 and 40; a conductor 54 is connected intermediate diodes 42 and 44; and a conductor 56 is connected intermediate diodes 46 and 48.

Phases $\phi A$, $\phi B$ and $\phi C$ of winding 4 are connected to conductors 47, 49 and 50, respectively, whiles phases $\phi D$, $\phi E$ and $\phi F$ of winding 6 are connected to conductors 52, 54 and 56, respectively.

A detector bridge designated generally by the numeral 58 includes a diode arrangement similar to that of rectifier bridge 2. Hence detector bridge 58 includes diode pairs 60, 62, 64, 66, 68 and 70. Diode pair 60 includes diodes 72 and 74; diode pair 62 includes diodes 76 and 78; diode pair 64 includes diodes 80 and 82; diode pair 66 includes diodes 84 and 86, diode pair 68 includes diodes 88 and 90; and diode pair 70 includes diodes 92 and 94. Diode pairs 60, 62, 64, 66, 68 and 70 are connected across conductors 96 and 98. The cathodes of diodes 72, 76, 80, 84, 88 and 92 are connected to conductor 96, while the anodes of diodes 74, 78, 82, 86, 90 and 94 are connected to conductor 98.

Rectifier bridge 2 is connected to detector bridge 58 through conductors 47, 49, 50, 52, 54 and 56. Conductor 47 is connected intermediate diodes 72 and 74; conductor 49 is connected intermediate diodes 76 and 78; conductor 50 is connected intermediate diodes 80 and 82; conductor 52 is connected intermediate diodes 84 and 86; conductor 54 is connected intermediate diodes 88 and 90; and conductor 56 is connected intermediate diodes 92 and 94. Conductor 10 is connected to the non-inverting input terminal (+) of a comparator amplifier 100 and conductor 96 is connected through a resistor 102 and a diode 95 to the inverting input terminal (−) of comparator amplifier 100. A resistor 104 is connected across conductors 10 and 96 intermediate resistor 102 and the non-inverting (+) and inverting (−) input terminals of amplifier 100.

Conductor 12 is connected to the inverting input terminal (−) of a comparator amplifier 106 and conductor 98 is connected to the non-inverting input terminal (+) of the comparator amplifier through a resistor 108 and a diode 121. A resistor 110 is connected across conductors 12 and 98 intermediate resistor 108 and the inverting (+) and non-inverting (−) input terminals of comparator amplifier 106.

Conductors 111, 112, 114, 116, 118 and 120 are connected to the cathodes of diodes 74, 78, 82, 86, 90 and 94, respectively. Conductors 111, 112 and 114 are connected through resistors 122, 124 and 126, respectively, to a phantom neutral voltage point 130, while conductors 116, 118 and 120 are connected through resistors 132, 134, and 136, respectively, to a phantom neutral voltage point 138.

A conductor 140 is connected to conductor 12 at a circuit point 142 and leads through a resistor 144 to the inverting input terminal (−) of a comparator amplifier 146. A conductor 148 is connected across conductors 10 and 140 through resistors 150, 152 and 156. A conductor 160 is connected from phantom neutral voltage point 130 to a conductor 162 at a circuit point 164. Conductor 162 leads through a diode 165 to the non-inverting input terminal (+) of a comparator amplifier 166. A conductor 168 connected intermediate resistors 150 and 152 leads to the non-inverting input terminal (+) of comparator amplifier 146 and a conductor 170 connected intermediate resistors 152 and 156 leads to the inverting input terminal (−) of comparator amplifier 166.

A conductor 172 is connected at a circuit point 174 to conductor 116 and is connected through a diode 176 to a circuit point 178 intermediate diode 165 and the non-inverting input terminal (+) of comparator amplifier 166. A resister 180, a capacitor 182 and a diode 184 are connected across conductors 140 and 172. A diode 185, a capacitor 187 and a resistor 189 are connected across conductors 140 and 162.

A conductor 186 is connected to conductor 172 at a circuit point 188 and is connected through a diode 190 to the inverting input terminal (−) of comparator amplifier 146. A conductor 192 is connected to conductor 162 at a circuit point 194 and is connected through a diode 196 to a circuit point 197 intermediate diode 190 and the inverting input terminal (−) of comparator amplifier 146.

The outputs of comparator amplifiers 100, 106, 146 and 166 are applied to an OR gate 198. OR gate 198 provides a "failed diode" output at an output conductor 200 which is applied to utilizing means 100 which may be an alarm device or a circuit tripping device as will be understood by those skilled in the art. The individual ouputs of comparator amplifiers 100, 106, 146 and 166 can also be used to provide individual indications of "open positive diode", "open negative diode", "shorted positive diode", and "shorted negative diode", respectively, if different priorities are to be assigned to these various failure modes.

OPERATION OF THE INVENTION

Diodes 72 through 94 form detector bridge 58. Resistors 122 through 126 provide a phantom neutral voltage at point 130 for phases φA, φB and φC of winding 4 and resistors 132 through 136 provide a phantom neutral voltage at point 138 for phases φD, φE and φF of winding 6. It will be understood that if only one three phase winding is used, only three resistors are necessary. If the windings are single phase, only two resistors are necessary.

The phantom neutral voltage at point 130 is filtered by capacitor 187 and resistor 189. Diode 185 limits the reverse voltage across capacitor 187 during fault conditions. The phantom neutral voltage at point 138 is filtered by resistor 180 and capacitor 182. Diode 184 limits the reverse voltage across capacitor 182 during fault conditions.

As long as all rectifier diodes 26 through 48 in rectifier bridge 2 are operable, (not shorts or opens) the filtered voltage at the respective phantom neutral points will be half the DC output of the rectifier bridge and the positive and negative detector bridge DC voltage will be equal to the positive and negative rectifier output voltage.

A shorted rectifier is detected by a shift in the phantom neutral voltage caused by the high negative and/or zero sequence currents in AC windings 4 and 6.

A voltage divider formed by resistors 150, 152 and 156 provides a reference voltage at the non-inverting input terminal (+) of comparator amplifier 146 which may be approximately 7% above the phantom neutral voltage, and a reference voltage at the inverting input terminal (−) of comparator amplifier 166 which may be approximately 7% below the phantom neutral voltage. Comparator amplifier 146 monitors the two phantom neutral voltages through isolating diodes 190 and 196 and resistor 144. Comparator amplifier 166 monitors the phantom neutral voltages through isolating diodes 165 and 176. The 7% reference margin is maintained regardless of the DC output voltage. This margin can be adjusted for more or less sensitivity as will be understood by those skilled in the art.

If a shorted positive rectifier diode occurs (one of the diodes connected between the AC windings and conductor 10) the phantom neutral voltage for that winding will be displaced in the positive direction. This causes the inverting input of comparator amplifier 146 to go positive with respect to the non-inverting input. Comparator 146 then produces a logic "one" output which sends a signal to OR gate 198 providing a failed diode signal at conductor 200. On the other hand, if a shorted negative diode occurs, (one of the diodes connected between the AC windings and conductor 12), the phantom neutral voltage for that winding will be displaced in the negative direction. The non-inverting input of comparator 166 will go negative with respect to its inverting input, resulting in comparator amplifier 166 providing a logic "one" output and hence a failed diode signal through OR gate 198 at output conductor 200. An open diode is detected by comparing the ripple voltage of rectifier bridge 2 with the ripple voltage of detector bridge 58. An open diode causes a missing peak to occur in the output voltage which does not occur in the detector bridge.

An open positive diode is detected by comparator amplifier 100. A failed diode signal is generated when a missing peak causes the non-inverting input of comparator amplifier 100 to decrease below the inverting input. An open negative diode is detected by comparator 106. A failed diode signal is generated when a missing peak causes the inverting input to increase above the non-inverting input. Diodes 95 and 121 compensate for IR drops in the DC feeders, but may not be necessary if feeders are very short. Resistors 102 and 104 and 108 and 116 provide current limiting during faults. If feeder drops are unusually large, more compensating diodes can be added to prevent false circuit tripping.

If a large capacitor or a battery load is connected to rectifier bridge 2, it may be necessary to have some resistive load connected in the circuit in order to detect an open diode. Extensive testing has shown that the required load is less than 50% of rated, however, so an overload condition on either the AC windings or the remaining diodes will not occur before the circuit trip level is reached.

It will now be understood by those skilled in the art that if only half-wave rectification is involved, the circuit can be simplified by eliminating negative diode failure detectors 106 and 166, assuming the half-wave rectifiers produce a +DC output.

What is claimed is:

1. For apparatus of the type including an AC voltage source and rectifier means having an arrangement of rectifying devices for rectifying the AC voltage from the voltage source to provide a DC voltage, means for detecting failed rectifying devices in the rectifier means comprising:

detector means having an arrangement of rectifying devices corresponding to the rectifier means arrangement of rectifying devices;
   the detector means connected to the AC voltage source for rectifying the AC voltage to provide a DC voltage;
   means arranged with the detector means rectifying devices for providing a phantom neutral voltage; and
   means connected to the rectifier means, the detector means and the means for providing a phantom neutral voltage, and responsive to the rectifier means DC voltage, the detector means DC voltage and the phantom neutral voltage for detecting predetermined relationships between the rectifier means DC voltage and the detector means DC voltage, and between the phantom neutral voltage and the rectifier means DC voltage, and for providing outputs indicative of said relationships.

2. Means as described by claim 1, wherein the means connected to the rectifier means, the detector means and the means for providing a phantom neutral voltage, and responsive to the rectifier means DC voltage, the detector means DC voltage and the phantom neutral voltage for detecting predetermined relationships between the rectifier means DC voltage and the detector means DC voltage, and between the phantom neutral voltage and the rectifier means DC voltage, and for providing outputs indicative of said relationships includes:

first means for detecting when the rectifier means DC voltage and the detector means DC voltage are other than equal, and for thereupon providing an output which is indicative of an open rectifier device in the rectifier means; and
   second means for detecting when the phantom neutral voltage and the rectifier means DC voltage are at other than a predetermined ratio, and for thereupon providing an output which is indicative of a shorted rectifier device in the rectifier means.

3. Means as described by claim 2, including:
   an OR gate connected to the first and second means and responsive to one of the outputs therefrom for providing an output indicative of a failed rectifying device in the rectifier means.

4. Means as described by claim 3 including:
   means for utilizing the output indicative of a failed rectifier device in the rectifier means.

5. Means as described by claim 2, wherein the first means includes:
   comparator means connected to the rectifier means and to the detector means and comparing the ripple voltages of both of said means, with an open rectifying device causing a peak to be missing in the rectifier means ripple voltage whereupon the comparator means provides the output indicative of an open rectifying device in the rectifier means.

6. Means as described by claim 2, wherein the second means includes:
   means connected to the rectifier means and responsive to the DC voltage therefrom for providing a reference voltage; and
   comparator means connected to the reference voltage means and to the phantom voltage means for comparing the voltages therefrom, with a shorted rectifying device causing a shift in the phantom voltage relative to the reference voltage whereupon the comparator means provides the output indicative of a shorted rectifying device in the rectifier means.

7. Means as described by claim 1, wherein the means arranged with the detector means rectifying devices for providing a phantom neutral voltage includes:
   a plurality of resistors, each of which is connected to a corresponding rectifier device;
   the resistors connected to a common connection; and
   the common connection providing the phantom neutral voltage.

8. Means as described by claim 5, wherein:
   the arrangement of rectifying devices in the rectifier means and in the detector means includes rectifying devices which provide DC voltages in positive and negative senses;
   the comparator means includes first and second comparators, each having inverting and non-inverting input terminals;
   the rectifying devices in the rectifier means for providing a DC voltage in a positive sense connected to the non-inverting input terminal of the first comparator and the rectifying devices in the detector means for providing a DC voltage in a positive sense connected to the inverting input terminal of said first comparator, with a missing peak causing the voltage at the non-inverting input terminal of the first comparator to decrease below the voltage at the inverting input terminal, whereupon the first comparator provides an output indicative of an open rectifier device in the rectifying means which provides a DC voltage in the positive sense; and
   the rectifying devices in the rectifier means for providing a DC voltage in a negative sense connected to the inverting input terminal of the second comparator and the rectifying devices in the detector means for providing a DC voltage in a negative sense connected to the non-inverting input terminal of said second comparator, with a missing peak causing the voltage at the inverting input terminal of the second comparator to increase above the voltage at the non-inverting input terminal, whereupon the second comparator provides an output indicative of an open rectifier device in the rectifying means which provides a DC voltage in the negative sense.

9. Means as described by claim 6, wherein:

the arrangement of rectifying devices in the rectifying means and in the detector means includes rectifying devices which provide DC voltages in positive and negative senses;

the comparator means includes first and second comparators each having inverting and non-inverting input terminals;

the means for providing a reference voltage connected to the non-inverting input terminal of the first comparator and to the inverting input terminal of the second comparator;

the means for providing a phantom voltage connected to the inverting input terminal of the first comparator and to the non-inverting input terminal of the second comparator;

a shorted rectifying device in the rectifier means which provides a DC voltage in a positive sense causing the phantom neutral voltage to be displaced in the positive sense which causes the voltage at the inverting input terminal of the first comparator to go in a positive sense with respect to the voltage at the non-inverting input terminal, whereupon the first comparator provides an output indicative of a shorted rectifying device in the rectifier means which provides a DC voltage in the positive sense; and a shorted rectifying device in the rectifier means which provides a DC voltage in a negative sense causing the phantom neutral voltage to be displaced in the negative sense which causes the voltage at the non-inverting input terminal of the second comparator to go in a negative sense with respect to the voltage at the inverting input terminal, whereupon the second comparator provides an output indicative of a shorted rectifying device in the rectifying means which provides a DC voltage in the negative sense.

* * * * *